(12) United States Patent
Steel

(10) Patent No.: US 10,334,765 B1
(45) Date of Patent: Jun. 25, 2019

(54) RADIO FREQUENCY SHIELDING LOCK BOX

(71) Applicant: Jacob Daniel Steel, Roseville, CA (US)

(72) Inventor: Jacob Daniel Steel, Roseville, CA (US)

( * ) Notice: Subject to any disclaimer, the term of this patent is extended or adjusted under 35 U.S.C. 154(b) by 79 days.

(21) Appl. No.: 15/858,636

(22) Filed: Dec. 29, 2017

Related U.S. Application Data

(60) Provisional application No. 62/498,621, filed on Jan. 3, 2017.

(51) Int. Cl.
*H02G 3/08* (2006.01)
*H05K 5/00* (2006.01)
*H05K 9/00* (2006.01)
*E05B 85/02* (2014.01)
*E05B 19/00* (2006.01)

(52) U.S. Cl.
CPC ....... *H05K 9/0015* (2013.01); *E05B 19/0005* (2013.01); *E05B 85/02* (2013.01); *H05K 9/0081* (2013.01); *H05K 9/006* (2013.01)

(58) Field of Classification Search
CPC .................................. H05K 5/00; H02G 3/08
See application file for complete search history.

(56) References Cited

U.S. PATENT DOCUMENTS

| | | | |
|---|---|---|---|
| 2008/0011501 A1* | 1/2008 | Gates | H01R 13/508 174/50 |
| 2011/0233096 A1* | 9/2011 | Michels | B65D 25/205 206/459.5 |

\* cited by examiner

*Primary Examiner* — Jerry Wu
(74) *Attorney, Agent, or Firm* — John P. Costello; Costello Law Corp.

(57) ABSTRACT

An electronic shielding device used to secure articles like keys and key fobs from the radiating signals is disclosed. The electronic shielding device includes a housing having a lid member and a storage member, a locking unit for securing articles utilizing a locking mechanism and a plurality of attachment means connected with the housing. The lid member includes first latch member and the storage member includes a second latch member. The radiating signal includes radio frequency and electromagnetic signals. The lid member is detachably attached with the storage member utilizing the first latch member and the second latch member. The locking unit is keyed and coded to a customer's own specific key/lock. The electronic shielding device is designed to attach to an object such as but not limited to a vehicle, a door and a window.

16 Claims, 6 Drawing Sheets

RADIO FREQUENCY SHIELDING LOCK BOX

CROSS-REFERENCE TO RELATED APPLICATIONS

This patent application claims the benefit of U.S. Provisional Patent Application No. 62/498,621, which was filed on Jan. 3, 2017.

BACKGROUND OF THE DISCLOSURE

Technical Field of the Disclosure

The present disclosure relates generally to shielding devices, and more particularly to a radio frequency shielding lock box for securing electronic devices.

Description of the Related Art

Electronic devices include electrical systems that are sensitive to radio frequency interference (RFI) as well as electromagnetic interference (EMI) of several megahertz. Several approaches have been made to protect electronic components from external electric fields. A wide variety of radio frequency (RF) shielding boxes are available in the art. The RF shielding boxes restrict RF waves from nearby RF devices, emitting RF waves or electromagnetic (EM) waves. Shielding boxes are made with magnetic and conductive materials such as copper, aluminum, plastic, steel or any other composite material being used for restricting the RF waves.

In several existing methods, the RF shielding boxes allow RF signals to escape from within the electronic device housing depending on the material of the housing. Plastic shielded box housings offers no protection from RF or EM waves unless they are shielded with a highly conductive coating and are properly grounded. In order to overcome this issue, the plastic shielding box is being improved by coating with steel. Steel housings at very high frequencies offer some protection from magnetically generated interference, but lose a major degree of RF protection due to poor electrical conductivity.

In order to overcome the issue with steel housings, aluminum enclosures have been developed. Shielding boxes with aluminum provide good protection from RF signals and very high frequency EM signals due to their high degree of electrical conductivity. But when the EM signals are within low frequency ranges the aluminum shielding box provides very little protection. To overcome this low protection, EM/RF bags and pouches have been developed in which the bag or pouch is sealed around the electronic component and then placed in a cushioned box for essential physical protection. But when the RF/EM bag is opened, each time it must be replaced or resealed in order to maintain RF/EM protection.

Yet another shielding box includes a cardboard container positioned on its interior walls with anti-static plastic members. These anti-static plastic members are slotted with ribs for receiving the static sensitive devices. The disadvantage of such devices is that they are not electrically conductive and are merely anti-static.

There is thus a need for a shielding box that would shield RF and EM signals from entering into the shielded box thereby securing the components secured inside the box. Such a needed device would provide an enclosure that would not have the unfavorable qualities of boxes made of aluminum, steel, or plastic. Further, such a needed device would be portable and cost effective. The present invention overcomes the prior art shortcomings and accomplishes these and other critical objectives.

SUMMARY OF THE INVENTION

To minimize the limitations found in the prior art, and to minimize other limitations that will be apparent upon the reading of the specification, the preferred embodiment of the present invention provides a method for shielding radio frequency and electromagnetic signals from entering into the electronic shielding device thereby securing the components placed inside the electronic shielding device. The electronic shielding device also shields radio frequency and electromagnetic signals from escaping the electronic shielding device. The electronic shielding device includes a housing having a lid member and a storage member, a locking unit positioned on a top surface of the lid member is designed to secure at least one article inside the storage member utilizing a locking mechanism and a plurality of attachment means for connecting the lid member with the storage member. Additionally a first latch member and a second latch member are positioned on the lid member and storage member respectively.

The lid member is detachably attached to the storage member utilizing the plurality of attachment means. When the first latch member positioned at the lid member is engaged with the second latch member positioned at the storage member, the housing becomes closed and when the first latch member positioned at the lid member is disengaged with the second latch member positioned at the storage member, the housing becomes open. A locking unit protecting member that protects the locking unit acts as a covering membrane for the locking unit. The locking unit is keyed and coded to a customer's own specific key/lock in this preferred embodiment.

In the preferred embodiment, the storage member is sealed with a foam rubber to obstruct radiating signals. The electronic shielding device provides physical security and electronic security by blocking the radiating signals.

A first objective of the present embodiment is to obstruct the radiating signal thereby securing the articles present inside the electronic shielding device.

A second objective of the present embodiment is to provide a physical security by provide a locking unit. The locking unit is keyed and coded to a customer's own specific key/lock.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

As used herein, the singular forms "a", "an" and "the" include plural referents unless the context clearly dictates otherwise. "And" as used herein is interchangeably used with "or" unless expressly stated otherwise. As used herein, the term 'about' means+/−5% of the recited parameter. All embodiments of any aspect of the invention can be used in combination, unless the context clearly dictates otherwise.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "wherein", "whereas", "above," and "below" and words of similar import, when used in this application, shall refer to this application as a whole and not to any particular portions of the application.

The description of embodiments of the disclosure is not intended to be exhaustive or to limit the disclosure to the precise form disclosed. While the specific embodiments of, and examples for, the disclosure are described herein for illustrative purposes, various equivalent modifications are possible within the scope of the disclosure, as those skilled in the relevant art will recognize.

Figure 1:
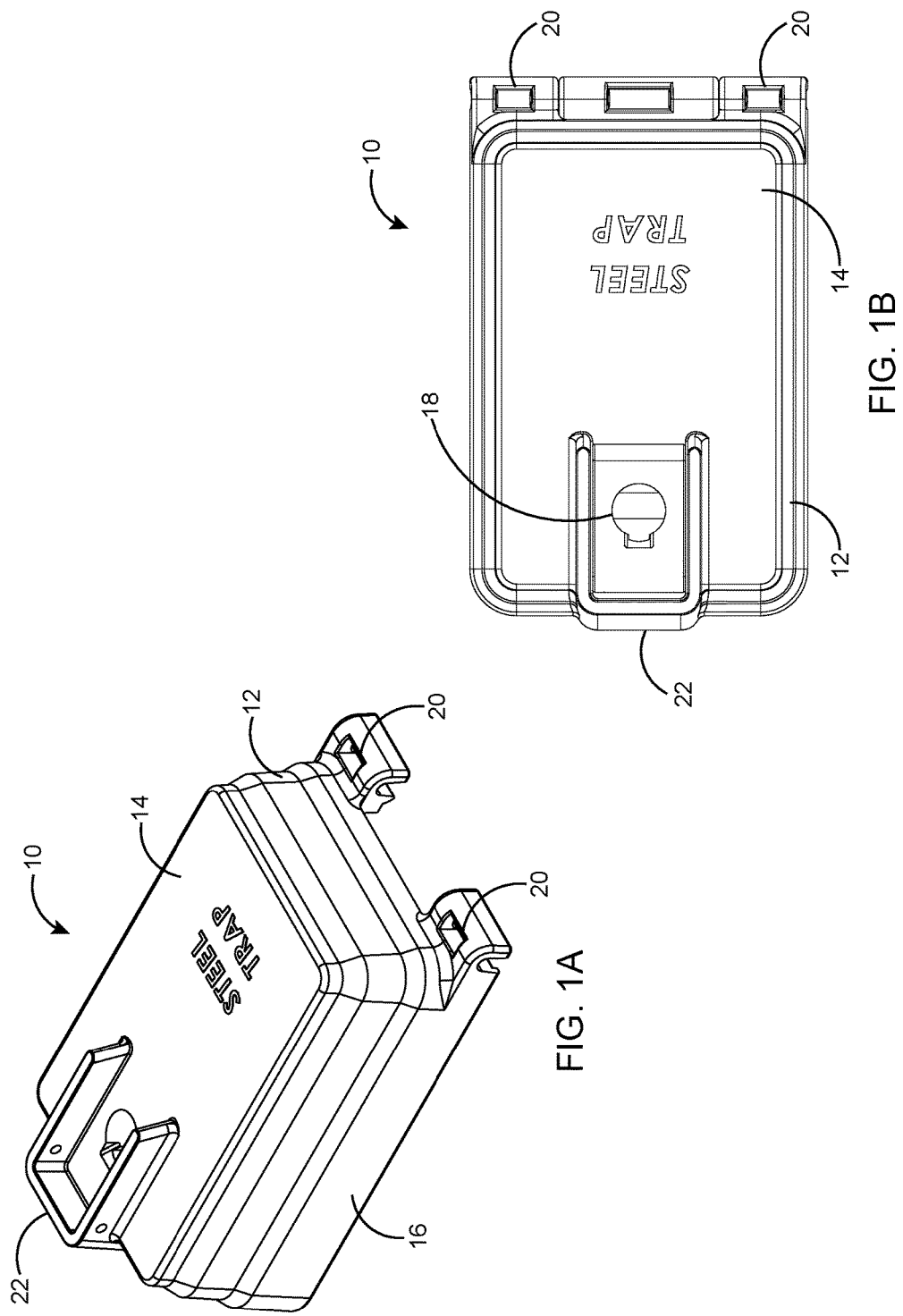
FIG. 1A is a perspective view of an electronic shielding device housing having a locking unit that receives a key in accordance with the preferred embodiment of the present invention.
FIG. 1B is a top view of an illustrative locking unit in an electronic shielding device housing in accordance with the preferred embodiment of the present invention.

FIG. 1A illustrates a perspective view of an electronic shielding device 10 in accordance with the preferred embodiment of the present invention. The electronic shielding device 10 is used to secure key and key fobs from the radiating signals. The electronic shielding device 10 includes a housing 12 having a lid member 14 and a storage member 16, a locking unit 18 positioned on a top surface of the lid member 14 is designed to secure at least one article inside the storage member 16 utilizing a locking mechanism, a plurality of attachment means 20 for connecting the lid member 14 with the storage member 16, a first latch member (not shown) positioned at the lid member 14 and a second latch member (not shown) positioned at the storage member 16.

Referring to FIG. 1B, the locking unit 18 positioned on a top surface of the lid member 14 is designed to secure at least one article inside the storage member 16 utilizing a locking mechanism. The electronic shielding device 10 prevents the entry and exit of at least one radiating signal to and from the housing 12 thereby securing the at least one article placed inside the storage member 16. The at least one article inside the storage member 16, mentioned in the present embodiment is a key and a key fob. In the electronic shielding device 10 the at least one radiating signal includes radio frequency and electromagnetic signals. The electronic shielding device can be applied in car sales lots where an electronic key and/or a key fob can be contained therein, thus preventing the emission of radiating signals by the electronic key. This prevents thieves from downloading the coded signal being emitted from the key, which would allow said thief to manufacture an electronic key and steal a car.

Figure 2:
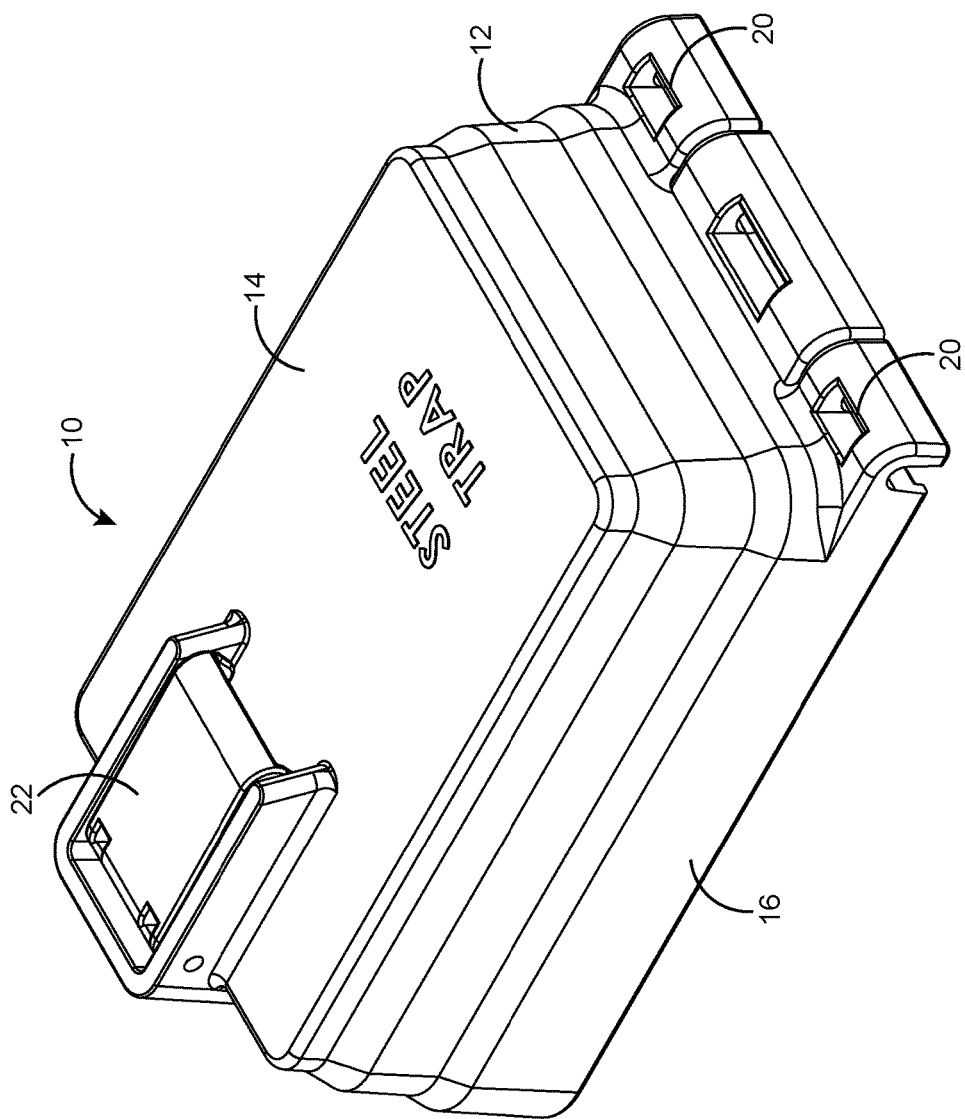
FIG. 2 is a perspective view of an electronic shielding device in accordance with the preferred embodiment of the present invention.
Figure 3B:
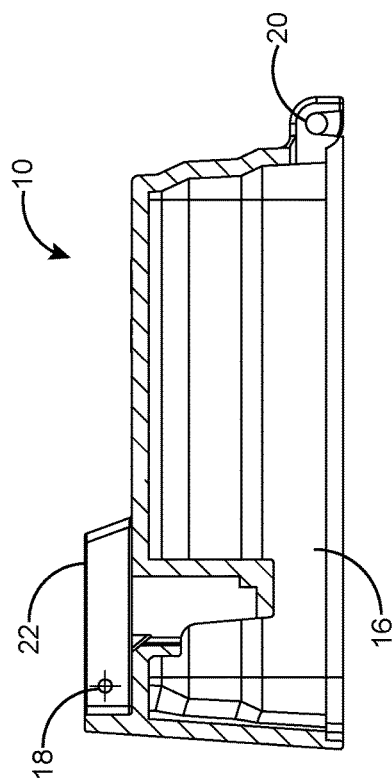
FIG. 3B is a cross-sectional side view of an electronic shielding device in accordance with the preferred embodiment of the present invention.
Figure 3A:
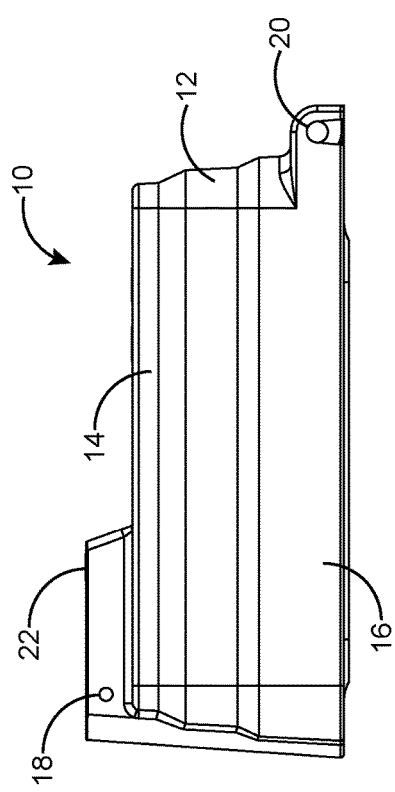
FIG. 3A is a side view of an electronic shielding device in accordance with the preferred embodiment of the present invention.
Figure 4A:
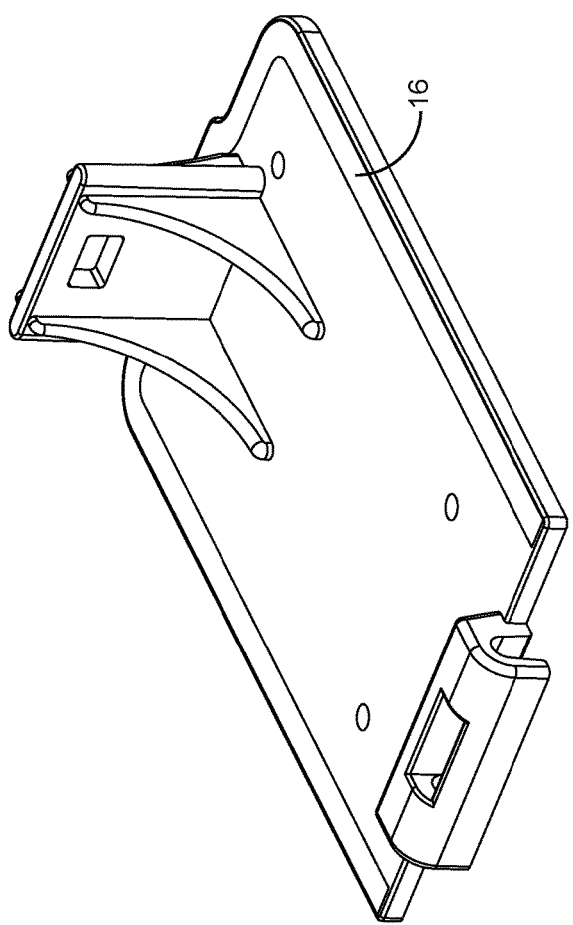
FIG. 4A perspective view of a storage member in an electronic shielding device housing in accordance with the preferred embodiment of the present invention.
Figure 4B:
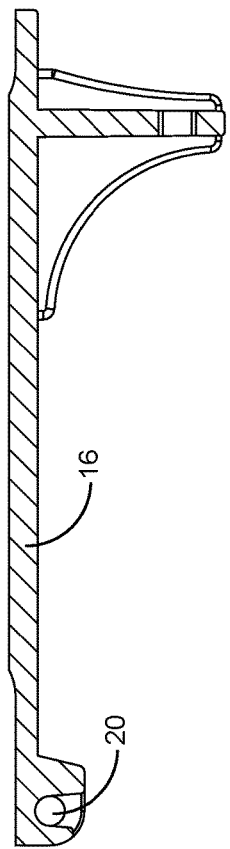
FIG. 4B is a cross-sectional side view of a storage member in an electronic shielding device housing having a plurality of attachment means in accordance with the preferred embodiment of the present invention.
Figure 5B:
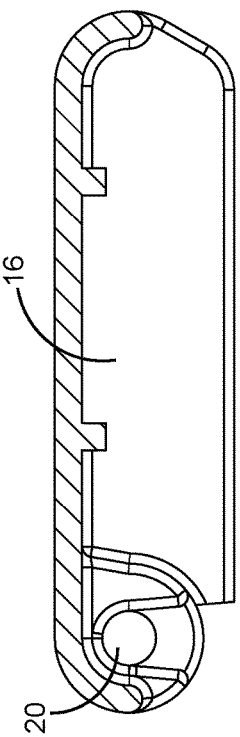
FIG. 5B is a cross-sectional rear side perspective view of an electronic shielding device in accordance with the preferred embodiment of the present invention.
Figure 5A:
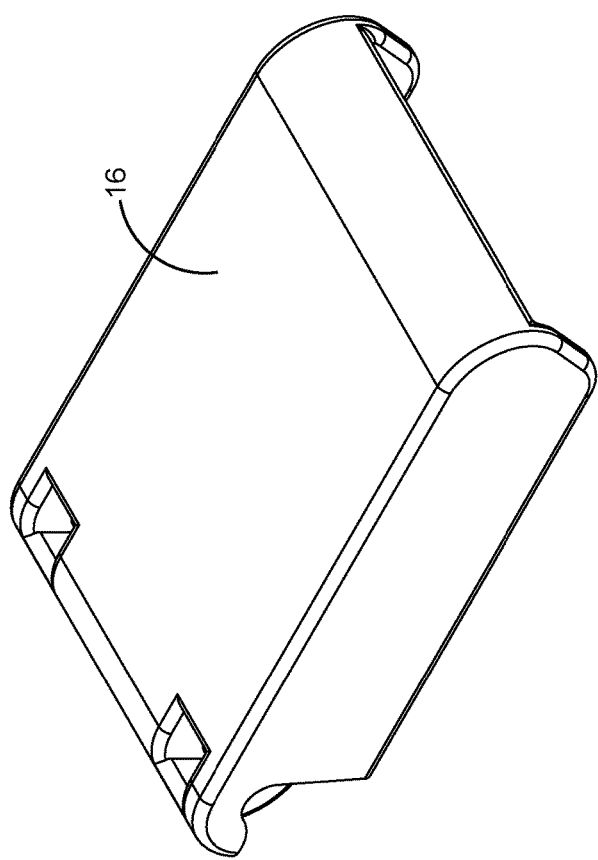
FIG. 5A is a rear side perspective view of an electronic shielding device in accordance with the preferred embodiment of the present invention.

With reference to FIG. 2, which illustrates a locking unit protecting member 22 that protects the locking unit 18 acts as a covering membrane for the locking unit 18. The locking unit 18 is keyed and coded to a customer's own specific key/lock. The lid member 14 is detachably attached to the storage member 16 utilizing the plurality of attachment means 20. The plurality of attachment means 20 is selected from a group consisting of: hinge rod, clamp, nut and bolt, buckle and clip. In the preferred embodiment the plurality of attachment means 20 is a steel hinge rod. In the electronic shielding device 10 when the first latch member (not shown) positioned at the lid member 14 is engaged with the second latch member (not shown) positioned at the storage member 16, the housing 12 becomes closed. In the electronic shielding device 10 when the first latch member (not shown) positioned at the lid member 14 is disengaged with the second latch member (not shown) positioned at the storage member 16, the housing 12 becomes open.

In the preferred embodiment the electronic shielding device 10 is made of a unique radio frequency composite material, that it provides shielding of the articles present in the storage member 16 without any additional securing resources, thereby eliminating the need of internal bags/boxes to do signal blocking. The electronic shielding device 10 acts as a "Faraday cage". The term "Faraday cage" refers to a shield comprising a conductive material used to block or attenuate specific radio frequencies or a range of radio frequencies.

Figure 6:
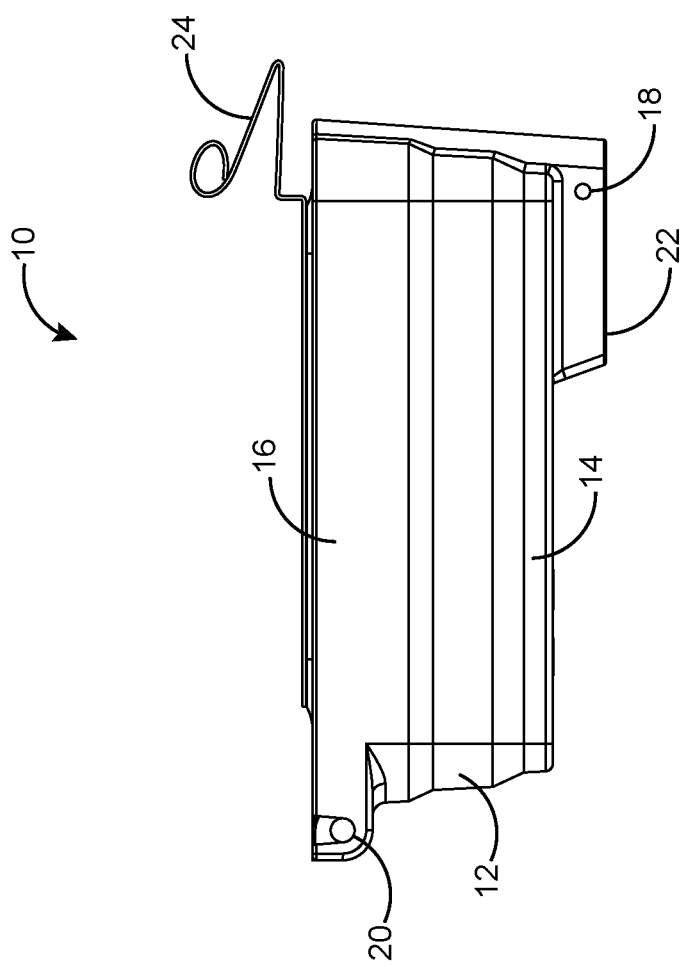
FIG. 6 is a side view of an electronic shielding device housing in accordance with an embodiment of the present invention.

FIGS. 3A-5B illustrate the electronic shielding device 10 wherein the plurality of attachment means 20 are positioned on the bottom side of the storage member 16. The electronic shielding device 10 is designed to attach to a vehicle, a door, a window and an object utilizing a fastening means. The electronic shielding device 10 wherein the storage member 16 is sealed with a foam rubber to obstruct radiating signals. The electronic shielding device 10 provides physical security and electronic security by blocking the radiating signals thereby securing the at least one article present in the storage member 16. More particularly, this invention pertains to a portable shield which will protect the at least one article against radiating signals. With reference to FIG. 6, which illustrates the electronic shielding device 10 wherein the rear side of the storage member 16 is designed with a clamp 24 for attaching the electronic shielding device 10 to a vehicle, a door, a window and an object.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

What is claimed is:

1. An electronic shielding device comprising: a housing having a lid member and a storage member; a locking unit for securing at least one fob utilizing a locking mechanism; and a plurality of attachment means connected with the housing through a hinge on a first bottom edge of the housing; whereby the electronic shielding device prevents the entry and exit of at least one radiating signal to and from the housing thereby securing at least one fob placed inside the storage member; and the locking unit having a center wall extended from an edge of a top wall of the lib member diagonal to the first bottom edge, two side walls extended from the center wall and the top wall of the lib member; and the locking unit having a cover with a hinge on a top edge of the center wall; the cover substantially flush with the center wall and the two side walls.

2. The electronic shielding device of claim 1 wherein the locking unit positioned on a top surface of the lid member is designed to secure the at least one article inside the storage member.

3. The electronic shielding device of claim 1 wherein the lid member includes a first latch member and the storage member includes a second latch member.

4. The electronic shielding device of claim 1 wherein the locking unit prevents at least one radiating signal to pass through the housing.

5. The electronic shielding device of claim 1 wherein the at least one radiating signal includes radio frequency and electromagnetic signal.

6. The electronic shielding device of claim 1 wherein the at least one article is a key.

7. The electronic shielding device of claim 1 wherein the at least one article is a key fob.

8. An electronic shielding device comprising: a housing having a lid member and a storage member; a locking unit positioned on a top surface of the lid member being designed to secure at least one fob inside the storage member utilizing a locking mechanism, the locking unit prevents at least one radiating signal to pass through the housing; and a plurality of attachment means for connecting the lid member with the storage member through a hinge on a first bottom edge of the housing; whereby the electronic shielding device prevents the entry and exit of at least one radiating signal to and from the housing thereby securing at least one fob placed inside the storage member; and the locking unit having a center wall extended from an edge of a top wall of the lib member diagonal to the first bottom edge, two side walls extended from the center wall and the top wall of the lib member; and the locking unit having a cover with a hinge on a top edge of the center wall; the cover substantially flush with the center wall and the two side walls.

9. The electronic shielding device of claim 8 wherein the at least one radiating signal includes radio frequency and electromagnetic signals.

10. The electronic shielding device of claim 8 wherein the lid member includes a first latch member and the storage member includes a second latch member.

11. The electronic shielding device of claim 8 wherein the at least one article is a key.

12. The electronic shielding device of claim 8 wherein the at least one article is a key fob.

13. An electronic shielding device comprising: a housing having a lid member and a storage member; a locking unit positioned on a top surface of the lid member being designed to secure at least one fob inside the storage member utilizing a locking mechanism; a first latch member positioned at the lid member; a second latch member positioned at the storage member; and a plurality of attachment means for connecting the lid member with the storage member through a hinge on a first bottom edge of the housing; whereby the electronic shielding device prevents the entry and exit of at least one radiating signal to and from the housing thereby securing at least one fob placed inside the storage member; and the locking unit having a center wall extended from an edge of a top wall of the lib member diagonal to the first bottom edge, two side walls extended from the center wall and the top wall of the lib member; and the locking unit having a cover with a hinge on a top edge of the center wall; the cover substantially flush with the center wall and the two side walls.

14. The electronic shielding device of claim 13 wherein the at least one radiating signal includes radio frequency and electromagnetic signals.

15. The electronic shielding device of claim 13 wherein the at least one article is a key.

16. The electronic shielding device of claim 13 wherein the at least one article is a key fob.

* * * * *